United States Patent
Helmick et al.

(10) Patent No.: US 10,811,112 B2
(45) Date of Patent: Oct. 20, 2020

(54) WEAR LEVELING WITH WEAR-BASED ATTACK DETECTION FOR NON-VOLATILE MEMORY

(71) Applicant: Western Digital Technologies, Inc., San Jose, CA (US)

(72) Inventors: Daniel Helmick, Broomfield, CO (US); Amir Gholamipour, Irvine, CA (US); James Fitzpatrick, Sudbury, MA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 94 days.

(21) Appl. No.: 16/147,653

(22) Filed: Sep. 29, 2018

(65) Prior Publication Data
US 2020/0105354 A1    Apr. 2, 2020

(51) Int. Cl.
*G06F 12/00*    (2006.01)
*G11C 16/34*    (2006.01)
*G06F 12/02*    (2006.01)

(52) U.S. Cl.
CPC ...... *G11C 16/3495* (2013.01); *G06F 12/0238* (2013.01); *G06F 2212/7211* (2013.01)

(58) Field of Classification Search
CPC ............ G11C 16/3495; G06F 12/0238; G06F 2212/7211
See application file for complete search history.

(56) References Cited

U.S. PATENT DOCUMENTS

| | | | |
|---|---|---|---|
| 5,754,871 A | 5/1998 | Wilkinson et al. | |
| 7,774,575 B2 | 8/2010 | Seto et al. | |
| 8,019,925 B1 | 9/2011 | Vogan et al. | |
| 8,667,301 B2 | 3/2014 | Farrugia et al. | |
| 8,725,931 B1* | 5/2014 | Kang | G06F 13/1642 711/103 |
| 8,806,171 B2 | 8/2014 | Seong et al. | |
| 2009/0172253 A1* | 7/2009 | Rothman | G06F 12/0246 711/103 |
| 2012/0131304 A1* | 5/2012 | Franceschini | G06F 12/0246 711/202 |
| 2012/0324141 A1* | 12/2012 | Seong | G06F 12/0238 711/3 |
| 2014/0052899 A1 | 2/2014 | Nan | |
| 2015/0052291 A1 | 2/2015 | Shibata | |

(Continued)

OTHER PUBLICATIONS

U.S. Appl. No. 15/949,976 (2380.2.321) Office Action, dated May 16, 2019.
(Continued)

*Primary Examiner* — Prasith Thammavong
(74) *Attorney, Agent, or Firm* — Kunzler Bean & Adamson, PC

(57) ABSTRACT

Apparatuses, systems, and methods are disclosed for wear leveling for non-volatile memory. An apparatus may include one or more non-volatile memory elements, and a controller. A controller may perform a wear-leveling process for one or more non-volatile memory elements, by periodically updating a logical-to-physical mapping and moving data based on the updated mapping. A controller may detect a wear-based attack for one or more non-volatile memory elements. A controller may change a wear-leveling process in response to detecting a wear-based attack.

24 Claims, 9 Drawing Sheets

(56) References Cited

U.S. PATENT DOCUMENTS

2018/0357010 A1* 12/2018 Inbar .................. G06F 12/10
2019/0108119 A1*  4/2019 Gholamipour ....... G11C 16/349
2019/0108889 A1*  4/2019 Gholamipour ....... G11C 16/349
2019/0310780 A1  10/2019 Gholamipour et al.
2020/0105354 A1*  4/2020 Helmick ............. G06F 12/0238

OTHER PUBLICATIONS

U.S. Appl. No. 15/949,976 (2380.2.321) Notice of Allowance, dated Oct. 9, 2019.

* cited by examiner

410 →

| 412 | 414a | 414b | 414c | 414d |
|---|---|---|---|---|
| PA 0 | LA 0 | LA 1 | LA 2 | LA 3 |
| PA 1 | LA 1 | LA 0 | LA 3 | LA 2 |
| PA 2 | LA 2 | LA 3 | LA 0 | LA 1 |
| PA 3 | LA 3 | LA 2 | LA 1 | LA 0 |

420 →

| 412 | 424a | 424b | 424c | 424d |
|---|---|---|---|---|
| PA 0 | LA 2 | LA 1 | LA 3 | LA 0 |
| PA 1 | LA 3 | LA 0 | LA 2 | LA 1 |
| PA 2 | LA 0 | LA 3 | LA 1 | LA 2 |
| PA 3 | LA 1 | LA 2 | LA 0 | LA 3 |

430 →

| 412 | 434a | 434b | 434c | 434d | 434e | 434f | 434g | 434h | 434i | 434j | 434k |
|---|---|---|---|---|---|---|---|---|---|---|---|
| PA 0 | LA 0 | LA 0 | LA 0 | LA 0 | Gap | LA 3 | LA 3 | LA 3 | LA 3 | Gap | LA 2 |
| PA 1 | LA 1 | LA 1 | LA 1 | Gap | LA 0 | LA 0 | LA 0 | LA 0 | Gap | LA 3 | LA 3 |
| PA 2 | LA 2 | LA 2 | Gap | LA 1 | LA 1 | LA 1 | LA 1 | Gap | LA 0 | LA 0 | LA 0 |
| PA 3 | LA 3 | Gap | LA 2 | LA 2 | LA 2 | LA 2 | Gap | LA 1 | LA 1 | LA 1 | LA 1 |
| PA 4 | Gap | LA 3 | LA 3 | LA 3 | LA 3 | Gap | LA 2 | LA 2 | LA 2 | LA 2 | Gap |

| 412 | 414a | 414b | 414c | 414d |
|---|---|---|---|---|
| PA 0 | LA 0 | LA 1 | LA 2 | LA 3 |
| PA 1 | LA 1 | LA 0 | LA 3 | LA 2 |
| PA 2 | LA 2 | LA 3 | LA 0 | LA 1 |
| PA 3 | LA 3 | LA 2 | LA 1 | LA 0 |

650

430 →

| 412 | 434a | 434b | 434c | 434d | 434e | 434f | 434g | 434h | 434i | 434j | 434k |
|---|---|---|---|---|---|---|---|---|---|---|---|
| PA 0 | LA 0 | LA 0 | LA 0 | LA 0 | Gap | LA 3 | LA 3 | LA 3 | LA 3 | Gap | LA 2 |
| PA 1 | LA 1 | LA 1 | LA 1 | Gap | LA 0 | LA 0 | LA 0 | LA 0 | Gap | LA 3 | LA 3 |
| PA 2 | LA 2 | LA 2 | Gap | LA 1 | LA 1 | LA 1 | LA 1 | Gap | LA 0 | LA 0 | LA 0 |
| PA 3 | LA 3 | Gap | LA 2 | LA 2 | LA 2 | LA 2 | Gap | LA 1 | LA 1 | LA 1 | LA 1 |
| PA 4 | Gap | LA 3 | LA 3 | LA 3 | LA 3 | Gap | LA 2 | LA 2 | LA 2 | LA 2 | Gap |

|  | 720a | 720b |
|---|---|---|
| Move Trigger 702 | 100 Writes | 501 Accesses |
| Move Size 704 | 2 Locations | 4 Locations |
| # Groups 706 | 4 Groups | 3 Groups |
| Group Size 708 | 25 Locations | 33 Locations |

FIG. 7

WEAR LEVELING WITH WEAR-BASED ATTACK DETECTION FOR NON-VOLATILE MEMORY

TECHNICAL FIELD

The present disclosure, in various embodiments, relates to non-volatile memory, and more particularly relates to wear leveling for non-volatile memory.

BACKGROUND

Various properties of a non-volatile memory medium may be negatively affected by excessive wear. Frequent reads of a physical memory region may disturb stored data in the region or in neighboring regions. Frequent writes to a physical region may wear out the region, reducing the life time or capacity of a memory device or element, or may disturb data stored in neighboring regions. Wear-leveling to avoid such disturbances may include changing mappings between logical and physical addresses for memory media over time, so that the wear or disturbance caused by repeated reads or writes at a single logical address is distributed over multiple physical locations. However, certain patterns of repetitive data access may coincide with a pattern of logical-to-physical mapping changes, resulting in excessive reads or writes to a single physical location despite the wear leveling.

SUMMARY

Apparatuses are presented for wear leveling for non-volatile memory. In one embodiment, an apparatus includes one or more non-volatile memory elements and a controller. In a certain embodiment, a controller is configured to perform a wear-leveling process for one or more non-volatile memory elements, by periodically updating a logical-to-physical mapping and moving data based on the updated mapping. In a further embodiment, a controller is configured to detect a wear-based attack for one or more non-volatile memory elements. In certain embodiments, a controller is configured to change a wear-leveling process in response to detecting a wear-based attack.

Methods are presented for wear leveling for non-volatile memory. In one embodiment, a method includes performing a wear-leveling process for one or more non-volatile memory elements by periodically changing a logical-to-physical mapping and moving data based on the changed mapping. In a certain embodiment, a method includes determining whether an access count for one or more non-volatile memory elements violates a threshold. In a further embodiment, a method includes modifying a wear-leveling parameter by updating a stored parameter value, in response to determining that an access count violates a threshold.

An apparatus, in another embodiment, includes means for wear-leveling one or more non-volatile memory elements by periodically updating a logical-to-physical mapping according to a set of one or more wear-leveling parameters and a sequence of logical-to-physical mappings, and moving data based on the updated mapping. In a certain embodiment, an apparatus includes means for detecting a wear-based attack for one or more non-volatile memory elements. In a further embodiment, an apparatus includes means for changing a sequence of logical-to-physical mappings in response to detecting a wear-based attack.

Systems are presented for wear leveling for non-volatile memory. In one embodiment, a system includes a plurality of physical storage locations for a storage device, and a device controller. In a certain embodiment, a device controller is configured to detect a wear-based attack for a plurality of physical storage locations. In a further embodiment, a device controller is configured to change a set of one or more wear-leveling parameters in response to detecting a wear-based attack. In one embodiment, a device controller is configured to perform a wear-leveling process using a changed set of one or more wear-leveling parameters.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 4 is a schematic block diagram illustrating sequences of logical-to-physical mappings, in various embodiments;

FIG. 6 is a schematic block diagram illustrating another embodiment of a change between sequences of logical-to-physical mappings;

FIG. 7 is a table illustrating certain embodiments of wear-leveling parameters;

DETAILED DESCRIPTION

Figure 1:
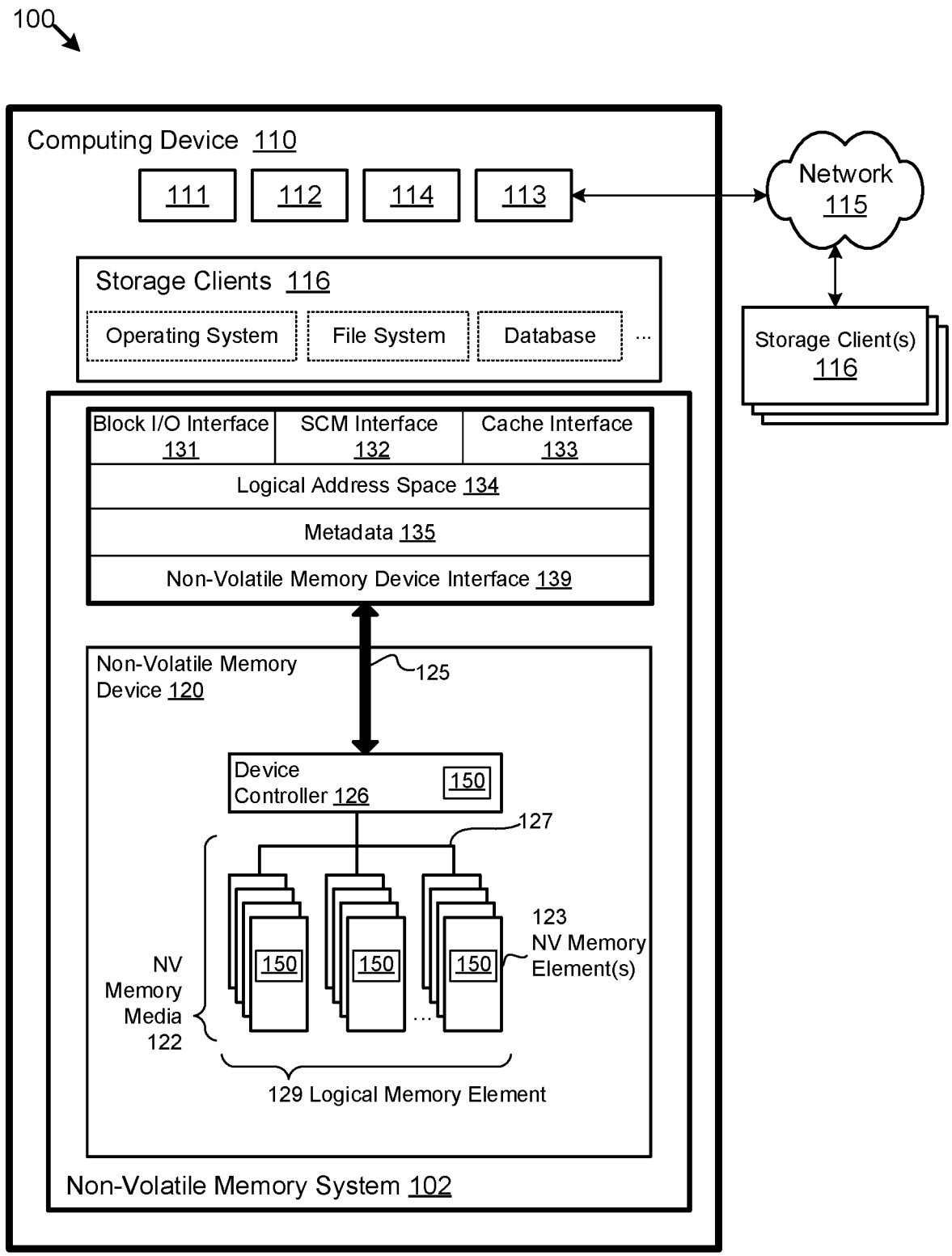
FIG. 1 is a schematic block diagram illustrating one embodiment of a system comprising non-volatile memory elements.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more map components 150 for a non-volatile memory device 120. Map components 150 may be part of one or more non-volatile memory elements 123, a device controller 126 external to the non-volatile memory elements 123, a device driver, or the like. Map components 150 may be part of a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a Serial Advanced Technology Attachment (SATA) bus, a Parallel Advanced Technology Attachment (PATA) bus, a Small Computer System Interface (SCSI) bus, a FireWire bus, a Fibre Channel connection, a Universal Serial Bus (USB), a PCIe Advanced Switching (PCIe-AS) bus, Serially Attached SCSI (SAS), NVMe over Fabrics (NVMeoF), or the like. In another embodiment, the non-volatile memory device 120 may be disposed on a data network 115, such as an Ethernet network, an Infiniband network, SCSI RDMA over a network 115, a Storage Area Network (SAN), a Local Area Network (LAN), a Wide Area Network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein.

The non-volatile memory system 102, in the depicted embodiment, includes one or more map components 150. A map component 150, in one embodiment, may perform a wear-leveling process by periodically updating a logical-to-physical mapping, and moving data based on the updated mapping. Updating a logical-to-physical mapping may distribute wear or disturbance, caused by repeated reads or writes at a single logical address, over multiple physical locations. Moving the data based on the updated mapping may preserve relationships between logical addresses and data, by moving data of a logical address to a new physical location that corresponds to the logical address under the updated mapping.

In further embodiments, the map component 150 may detect a wear-based attack, and may change the wear-leveling process in response to detecting the wear-based attack. In various embodiments, a wear-based attack may be a deliberate or inadvertent pattern of accesses for the non-volatile memory device. In certain embodiments, a wear-based attack may degrade the performance of the non-volatile memory device 120, and/or may bring the non-volatile memory device 120 toward end-of-life. In some embodiments, a wear-based attack may create security issues. For example, interactions between storage regions due to proximity in location (e.g., heat-related interactions, magnetic or electrical cross talk, or other physical or electrical interactions), or due to electrical leakage in shared or co-located controlling circuitry, may cause a read or write operation at one region to affect, or be affected by, data in a nearby storage region. Thus, in certain embodiments, repeated reads or writes to certain regions may be used to read or alter protected data at a nearby region.

In certain embodiments, wear-based attacks may accidentally or deliberately counter the wear-leveling process. For example, in one embodiment, a client process that repeatedly changes stored data may be configured to periodically move the data to a new logical address to distribute wear, but may inadvertently align with the wear-leveling process updating the logical-to-physical mapping. Such alignment may result in excessive wear at a single physical location. In another embodiment, a persistent attacker may be able to gather sufficient information about the wear-leveling process to deliberately target it, creating a pattern of accesses to different logical addresses that results in excessive wear at a physical location. Thus, in various embodiments, a map component 150 changing the wear-leveling process in response to detecting a wear-based attack may frustrate a wear-based attack. For example, a change to the wear-leveling process may update logical-to-physical mappings in a way that is no longer aligned with an access pattern from client software, or may be inconsistent with what an attacker learned about the wear-leveling process prior to the change, thus frustrating the wear-based attack. Further, in certain embodiments, making a change to the wear-leveling process at periodic, random, pseudorandom, predetermined, or dynamically determined detection times may further frustrate wear-based attacks. Map components 150 are described in greater detail below with regard to FIGS. 2-9.

In one embodiment, a map component 150 may include logic hardware of one or more non-volatile memory devices 120, such as a device controller 126, a non-volatile memory element 123, other programmable logic, firmware for a non-volatile memory element 123, microcode for execution by a non-volatile memory element 123, or the like. In another embodiment, a map component 150 may include executable software code, stored on a computer readable storage medium for execution by logic hardware of a non-volatile memory element 123. In a further embodiment, a map component 150 may include a combination of both executable software code and logic hardware.

In one embodiment, the non-volatile memory device 120 is configured to receive storage requests from a device driver or other executable application via buses 125, 127, a device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), a cache line address, a memory address, a cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical-to-physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, persistent memory storage devices, storage class memory storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the storage class memory (SCM) interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, Serially Attached SCSI (SAS), NVMe over Fabrics (NVMeoF), a network 115, a fabric, Infiniband, Ethernet, Omnipath, GenZ, CCIX, OpenCAPI, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120.

Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: Resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise persistent memory (PM) and/or storage class memory (SCM).

While legacy technologies such as NAND flash may be block and/or page addressable, or may use block-level erase operations, storage class memory, in one embodiment, may be byte addressable, and may provide byte-level read and write operations (e.g., write operations may include byte-level program and byte-level erase operations, or may include byte-level write operations capable of overwriting data in place without a previous erase operation). In further embodiments, storage class memory may be faster and/or have a longer life (e.g., endurance and/or retention) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
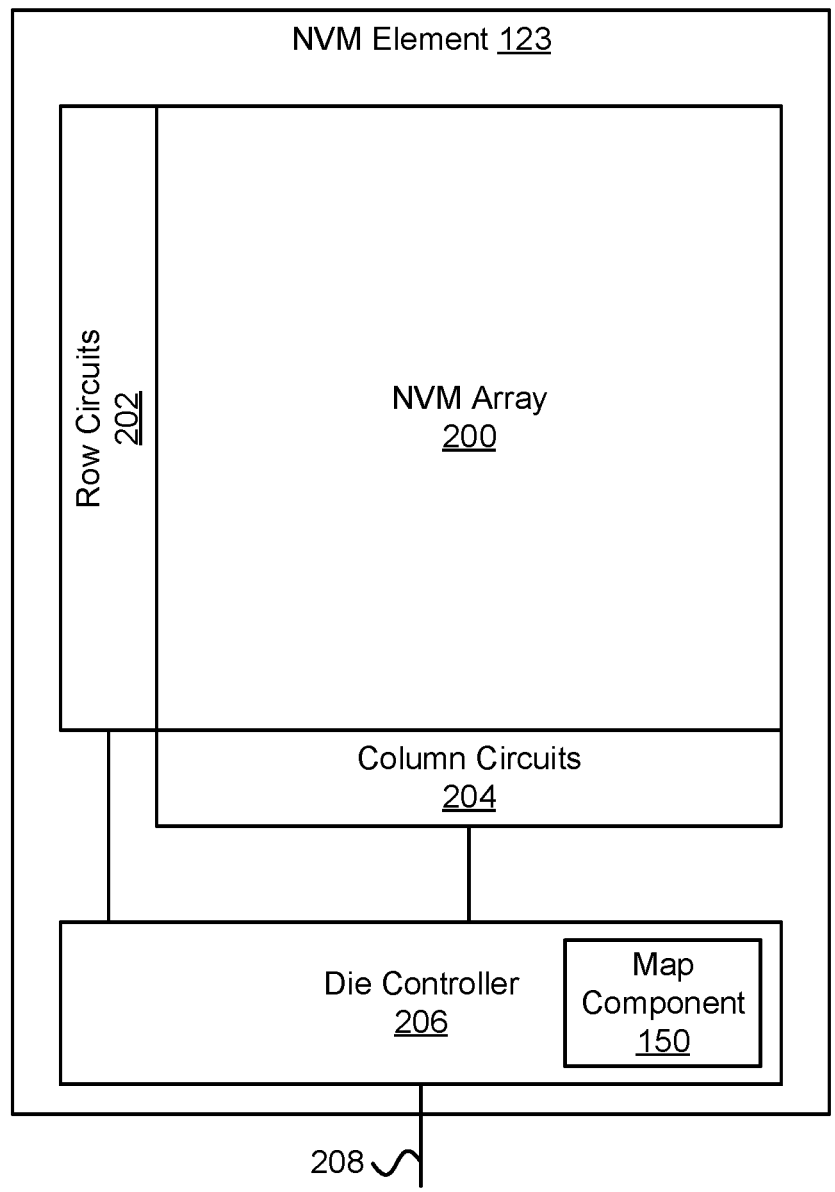
FIG. 2 is a schematic block diagram illustrating one embodiment of a non-volatile memory element.

FIG. 2 depicts one embodiment of a non-volatile memory element 123. The non-volatile memory element 123 may be substantially similar to the non-volatile memory element 123 described with reference to FIG. 1. The non-volatile memory element 123, in the depicted embodiment, includes an array 200 of non-volatile memory cells, row circuits 202, column circuits 204, and a die controller 206.

In various embodiments, a non-volatile memory element 123 may be an integrated circuit that includes both a core array 200 of memory cells for data storage, and peripheral components (e.g., row circuits 202, column circuits 204, and/or die controller 206) for communicating with the array 200. In certain embodiments, one or more non-volatile memory elements 123 may be included in a memory module, a storage device, or the like.

In the depicted embodiment, the array 200 includes a plurality of non-volatile memory cells for storing data. In one embodiment, the array 200 may be a two-dimensional array. In another embodiment, the array 200 may be a three-dimensional array that includes multiple planes and/or layers of non-volatile memory cells. In various embodiments, the array 200 may be addressable by rows via row circuits 202, and by columns via column circuits 204.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder or map component 150 that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via line 208, to receive command and address information, transfer data, or the like.

In the depicted embodiment, the die controller 206 includes a map component 150, which may be substantially similar to the map components 150 described with reference to FIG. 1. In certain embodiments, the map component 150 may translate a received logical address to a hardware physical address used by the row circuits 202 and column circuits 204. In further embodiments, the map component 150 may perform wear-leveling by periodically updating the logical-to-physical mapping, and moving data based on the updated mapping. In various embodiments, translating a logical address to a physical address using a logical-to-physical mapping, and/or updating the logical-to-physical mapping, may be done by a map component 150 of a die controller 206 for a non-volatile memory element 123, and/or may be done by a map component 150 of a device driver or device controller 126 for a non-volatile memory device 120 (e.g., where a physical address may refer to a location on a single non-volatile memory element 123, or to a stripe of locations on multiple non-volatile memory elements 123). In another embodiment, a map component 150 may include portions of a device driver, a device controller 126, one or more die controllers 206, and/or the like.

Figure 3:
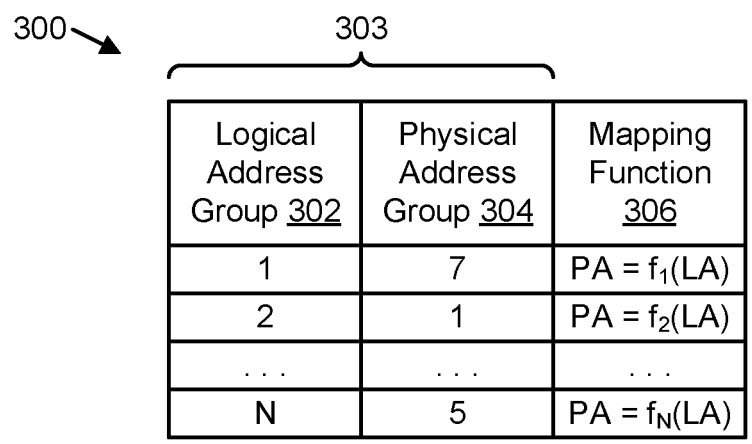
FIG. 3 is a schematic block diagram illustrating one embodiment of a logical-to-physical mapping.

FIG. 3 depicts one embodiment of a logical-to-physical mapping 300. In various embodiments, a map component 150 may maintain a logical-to-physical mapping 300 for converting logical addresses to physical addresses, may service storage requests pertaining to logical addresses by using the mapping 300 to determine corresponding physical addresses for reading or writing data of the requests, and may periodically update the logical-to-physical mapping 300 (and move data to new locations) for wear-leveling or for other purposes. In the depicted embodiment, the mapping 300 associates groups 302 of logical addresses with groups 304 of physical addresses. Additionally, in the depicted embodiment, mapping functions 306 for the groups 302, 304 associate individual logical addresses with individual physical addresses.

In general, in various embodiments, an "address," whether logical or physical, may be an identifier such as a number, a set of bits, a tuple, or the like, that identifies a location where data is, or may be, stored (e.g., a byte, page, or block of the array 200). For example, an address may be a logical block address that identifies a block of data storage, a cylinder/head/sector tuple that identifies a data location for a hard drive, a byte address that identifies a byte of memory, or the like. An address and a location identified by the address may be referred to interchangeably herein. For example, a memory operation such as a read or write operation may be said to be performed "at" an address, when data is read from or written to the location that the address refers to. In various embodiments, non-volatile memory elements 123 may be addressable at various granularities. For example, in various embodiments, addressable locations of a non-volatile memory device 120 may include blocks, partitions, arrays (e.g., array 200 for one or more non-volatile memory elements 123), subarrays, planes, rows, word lines, banks, ranks, or the like. As a further example, in one embodiment, a non-volatile memory element 123 for a storage device may be block addressable, so that an address identifies or refers to a block of multiple bytes similar to a hard drive sector (e.g., a 512 B block, a 2 KiB block, a 4 KiB block, an 8 KiB block, a 16 KiB block, or the like). In another embodiment, an address may refer to a stripe of locations across multiple non-volatile memory elements 123. In another embodiment, a non-volatile memory element 123 for storage class memory may be byte addressable, so that an address identifies or refers to a single byte of memory. In certain embodiments, a non-volatile memory device 120 may be addressable at multiple granularities. For example, a non-volatile memory device 120 may provide block-level and byte-level interfaces for addressing and accessing data. In another embodiment, non-volatile memory elements 123 may be addressable at the level of a memory cache (e.g., a 32 B cache line, a 64 B cache line, a 128 B cache line, or the like), and an address may identify or refer to a cache line. Various further types of addresses that may be used, in various embodiments, will be clear in view of this disclosure A "physical address," in various embodiments, may be any address that refers to a fixed physical location where data is, or may be, stored. Thus, repeated memory operations for a physical address will repeatedly access the same physical location. For example, a physical address may refer to a physical region of an array 200, to a stripe of physical locations across multiple non-volatile memory elements 123, or the like. In further embodiments, a "logical address" may be an address that does not refer to a fixed physical location. Instead, in certain embodiments, a logical address may be mappable to indicate, point to, or reference different physical addresses or locations. For example, a logical address may be mapped to correspond to a physical address or location, but may also be remapped to correspond to a different physical address or location. In certain embodiments, logical addresses may be used in an external interface for a non-volatile memory element 123 or a non-volatile memory device 120, and physical addresses may be used internally. For example, a storage client 116 may write data over an interface, indicating a logical address for writing the data, and a device controller 126 and/or die controller 206 may convert the logical address to a physical address for writing the data.

A logical-to-physical mapping 300, in various embodiments, may include any function, operation, data structure, or the like that associates logical addresses with physical addresses. A controller such as a device controller 126 or die controller 206 may maintain a logical-to-physical mapping 300 by storing information used to convert a logical address to a physical address, such as a data structure that associates logical addresses with physical addresses, parameters or a definition for a mathematical function that converts logical addresses to physical addresses, or the like. Logical-to-physical mapping information may be stored in volatile memory, in a known physical location on the non-volatile memory, or the like. Various types of logical-to-physical mapping information and ways to store and maintain a logical-to-physical mapping 300 will be clear in view of this disclosure.

In certain embodiments, a controller that maintains a logical-to-physical mapping 300 may use the logical-to-physical mapping 300 to convert logical addresses to physical addresses to perform data operations, such as read, write, program, or erase operations. For example, in one embodiment, a client 116 may request a data operation by issuing a command or request that indicates and/or includes a logical address, a range of logical addresses, an offset from a starting logical address, a set of addresses such as a Scatter Gather List (SGL), or the like. In a further embodiment, the device controller 126 and/or die controller 206 may receive the request, may use a logical-to-physical mapping 300 to convert a logical address of the request to a physical address, and may then perform the requested memory operation at the physical address.

In one embodiment, a logical-to-physical mapping 300 may include a lookup table for looking up which physical address corresponds to a logical address. In another embodiment, a logical-to-physical mapping 300 may include a function that receives a logical address as an input, and outputs a physical address as a result of performing certain mathematical and/or logical operations using the logical address. For example, in one embodiment, a logical-to-physical mapping 300 may include a bitwise exclusive or (XOR) function and a bitmask, so that taking the bitwise XOR of a logical address with the bitmask produces the corresponding physical address. Various other or further ways of mapping logical addresses to physical addresses will be clear in view of this disclosure.

In the depicted embodiment, a logical-to-physical mapping 300 maintained by a map component 150 includes a lookup table 303 that maps between groups of addresses, and includes mapping functions 306 for individual groups. In one embodiment, the logical-to-physical mapping 300 maps groups 302 of logical addresses to groups 304 of physical addresses. A group 302 of logical addresses may be any set or collection of logical addresses. Similarly, a group 304 of physical addresses may be any set or collection of physical addresses. In certain embodiments, a group 302, 304 of addresses may be a range of contiguous addresses. For example, Group 1 may include logical addresses 0-1024; Group 2 may include logical addresses 1024-2047, and so on. In another embodiment, a group 302, 304 of addresses may include noncontiguous addresses. In various embodiments, groups 302, 304 may be uniformly sized or may be of various sizes, and the group size, number of groups, or the like may vary based on how the lookup table 303 is configured, or on how groups are split, merged, updated, or the like.

In certain embodiments, groups 302, 304 may be predefined, or configured with a fixed definition. For example, a group 302 of logical addresses may be defined so that logical addresses with the same most significant byte (or least significant byte, or another portion of a logical address) are in the same group. In another embodiment, groups 302, 304 may be flexibly defined by the map component 150, allowing the map component 150 to merge, split or otherwise adjust the size or composition of different groups 302, 304. In certain embodiments, a map component 150 may maintain information such as metadata indicating or defining which logical addresses are in which groups 302, 304, and which physical addresses are in which groups 304. For example, a lookup table 303 for the mapping 300 may include group definition metadata (not shown). Alternatively, metadata that defines groups 302, 304 may be stored separately from the lookup table 303, or from other information defining or describing the mapping 300. Metadata that defines groups 302, 304 may include information identifying which addresses are in which groups 302, 304, such as a range of addresses that defines a group 302, 304, a starting address and group size for the group 302, 304, a portion of an address that corresponds to what group 302, 304 the address is in, or the like. Various further types of metadata for defining groups 302, 304 will be clear in view of this disclosure.

A lookup table 303 for a mapping 300, in various embodiments, may be any data structure that associates groups 302 of logical addresses (or individual logical addresses) with corresponding groups 304 of physical addresses (or individual physical addresses). In a further embodiment, the map component 150 may use the association between groups 302, 304 to determine which group 304 of physical addresses corresponds to a group 302 of logical addresses. Thus, in certain embodiments, a lookup table 303 may be indexed or ordered by logical address group 302. The term "table" is used to suggest the association between groups 302, 304, and is not intended as limiting. For example, in the depicted embodiment, the lookup table 303 is a literal table or two-dimensional array, where a logical address group 302 in a row of the table corresponds to a physical address group 304 in the next column of the same row. In another embodiment, however, a lookup table 303 may be another associative data structure such as a hash table with logical address groups 302 as keys and physical address groups 304 as values, a tree data structure where nodes are logical address group 302 and physical address group 304 pairs, or the like.

In a further embodiment, a logical-to-physical mapping 300 maintained by a map component 150 may include one or more mathematical mapping functions 306. In certain embodiments, a mathematical mapping function 306 for a group 302 of logical addresses may associate individual logical addresses within the group 302 of logical addresses with individual physical addresses within a corresponding group 304 of physical addresses.

Where a group 302 of logical addresses is given, known, or determined (e.g., based on a requested logical address), a "corresponding" group 304 of physical addresses may be the physical address group 304 that corresponds to or is associated with the logical address group 302 in the lookup table 303. For example, in FIG. 3, the physical address group 304 identified by the number 7 corresponds to the logical address group 302 identified by the number 1. In a further embodiment, a controller that receives a request for a data operation, where the request indicates a logical address, may convert the logical address to a physical address by identifying which logical address group 302 the requested logical address is in, using the lookup table 303 to identify which physical address group 304 corresponds to that logical address group 302, and using a mathematical mapping function 306 to identify a physical address within the physical address group 304.

A mathematical mapping function 306, in various embodiments, may be a mathematical function that associates a physical address with a logical address by returning a physical address, a portion of a physical address, an offset from a starting physical address for a group 304, or the like, as a function of a logical address, a portion of a logical address, an offset from a starting logical address for a group 302, or the like. The mathematical definition of a function is broad enough to encompass an any-to-any mapping such as a set of ordered pairs where each input point is paired with one output point (e.g., a lookup table for individual addresses), and in certain embodiments, a mapping function 306 may be an arbitrary or any-to-any mapping. In another embodiment, however, a mapping function 306 may be a relation that can be described by one or more formulas, expressions, or algorithmic steps other than lookups of potentially arbitrary or any-to-any associations. For example, using a mapping function 306 to determine a physical address from a logical address may involve separating the logical address into portions, reordering bytes of the logical address, performing arithmetical operations, bitwise logical operations, or the like, using one or more portions of the logical address. Various types of mathematical operations that may be performed, starting from a logical address, to transform the logical address to a physical address, will be clear in view of this disclosure.

In the depicted embodiment, the mapping functions 306 include a set of functions $f_1$-$f_N$ corresponding to logical address groups 302 numbered 1 through N, so that $f_1$ maps logical addresses in group 1 to physical addresses in a corresponding group, $f_2$ maps logical addresses in group 2 to physical addresses in a corresponding group, and so on. In one embodiment, the map component 150 may define or store a mapping function 306 for each logical address group 302, for each physical address group 304, or the like. For example, the map component 150 may store function definitions for mapping functions 306 with the lookup table 303, or separately from the lookup table 303. In another embodiment, the map component 150 may use a mapping function 306 with one or more variable parameters for multiple groups, and may store parameters for the different logical address groups 302, or physical address groups 304. For example, in one embodiment, the mapping functions 306 for multiple groups may be based on a bitwise exclusive or (XOR) function, so that at least a portion of a physical address is obtained by computing the XOR of a bitmask and at least a portion of a logical address. In a further embodiment, the map component 150 may store bitmasks for the different logical address groups 302, or physical address groups 304, as parameters to be used with the XOR function.

In various embodiments, the map component 150 may map logical addresses to physical addresses using the lookup table 303 and the mapping functions 306. For example, in the depicted embodiment, the map component 150 may receive a request to read or write data at a logical address, and may determine a logical address group 302 to which the logical address belongs. The map component 150 may then use the lookup table 303 to determine a corresponding physical address group 304. For example, in the depicted embodiment, if the received logical address is in logical address group 2, the lookup table 303 table indicates that the corresponding physical address will be in physical address group 1. The map component 150 may then use the function $f_2$ as a mapping function 306 for logical addresses in group 2, by applying the function $f_2$ to the logical address to return a physical address (in physical address group 1). A controller such as a device controller 126 or die controller 206 may then perform the read or write operation at the physical address (e.g., at the physical location identified by the physical address).

In certain embodiments, using a lookup table 303 to associate logical address groups 302 with physical address groups 304 may provide flexible or any-to-any mapping that facilitates flexible wear leveling without using large amounts of memory. In further embodiments, using mathematical mapping functions 306 to associate logical addresses within a logical address group 302 to physical addresses within a physical address group 304 may provide fast and/or low-memory mapping by storing a function or parameters rather than a large associative data structure. For example, in certain embodiments, using a large associative data structure stored in volatile memory may involve several steps just to access the volatile memory, while using a mathematical mapping 306 may involve performing a small number of operations, implemented in a small area of the controller or with a small gate count, to convert a logical address to a physical address. In further embodiments, using mathematical mapping functions 306 may facilitate design of fast and simple hardware implementations for a device controller 126 or die controller 206.

In certain embodiments, a map component 150 may perform a wear-leveling process for the one or more non-volatile memory elements 123 by periodically updating a logical-to-physical mapping 300 and moving data based on the updated mapping. In various embodiments, updating a logical-to-physical mapping 300 may include any change that results in at least one logical address being remapped to a different physical address than the logical address was previously mapped to. For example, in one embodiment, updating a logical-to-physical mapping 300 may include remapping a large number of logical addresses (e.g., all or most of the addressable locations of a device). In another embodiment, updating a logical-to-physical mapping 300 may refer to remapping a single logical address to correspond to a new physical address, remapping a pair of logical addresses to swap corresponding physical addresses, or the like. In one embodiment, updating a logical-to-physical mapping 300 may include updating a lookup table 303. For example, in the depicted embodiment, the map component 150 may update the logical-to-physical mapping 300 by updating the lookup table to map a logical address group (or groups) 302 to a new physical address group (or groups) 304.

In a certain embodiment, updating a logical-to-physical mapping 300 may include changing one or more mapping functions 306. For example, in one embodiment, a map component 150 may change the mapping function 306 for the second logical address group 302 from a first function $f_2$ to a second function $g_2$ (not shown), while leaving other mapping functions 306 such as $f_1$ and $f_N$ for other logical address groups 302 unchanged. In another embodiment, a map component 150 may change the mapping functions 306 for multiple logical address groups 302, such as by changing functions $f_1$-$f_N$ to new functions $g_1$-$g_N$. In various embodiments, the controller may change mapping functions 306 one group at a time, in a predefined order or based on wear, or may change mapping functions 306 together for some or all of the logical address groups 302.

In various embodiments, changing a mapping function 306 may include changing a function that maps logical addresses to physical addresses, changing a parameter for a mapping function, changing a bitmask for an XOR-based mapping, or the like. For example, in various embodiments, changing a mapping function 306 may include changing a bitmask for an XOR-based mapping, or another parameter for a mapping function, to a random value, to a pseudo-random value determined based on a seed, to a subsequent value in a mathematical sequence (e.g., binary order, Gray code order, or any other mathematical sequence), randomly identifying a bit (or bits) to change in the bitmask (or other parameter), or the like. In further embodiments, changing a mapping function 306 may include storing the new mapping, function, parameter, or the like. Various ways of changing or updating a mapping function will be clear in view of this disclosure.

In certain embodiments, a map component 150 may update to a logical-to-physical mapping 300 gradually, to avoid moving large amounts of data at once. For example, a map component 150 may change an old mapping function 306 for a logical address group 302 to a new mapping function 306, but may use both mapping functions simultaneously for a period of time, keeping track of which logical addresses in the group 302 have been remapped using the new mapping function 306. The change to the mapping function 306 (eventually effecting the full set of logical addresses in the group 302), and/or a smaller update that hands over a subset of logical addresses (e.g., a pair) in the group 302 to the new mapping function 306, may both be referred to herein as changes to a logical-to-physical mapping 302, because both events result in at least one logical address being remapped.

In one embodiment, a map component 150 may update a mapping 300 by splitting a logical address group 302 into two groups. For example, in the depicted embodiment, a map component 150 may divide logical address group 1 into logical address groups 1a and 1b. In various embodiments, splitting or dividing a group may include determining a boundary between two new or split groups, recording metadata indicating which addresses are in which of the split or new groups, adding a row to the lookup table 303 for a new group, or the like. The corresponding physical address group 304 may also be split into two groups, by updating the lookup table 303. For example, the controller may divide the physical address group 7 corresponding to logical address group 1, into physical address groups 7a and 7b. In a further embodiment, a map component 150 may select new mapping functions 306 for new or split logical address groups 302.

Conversely, in another embodiment, a map component 150 may update a mapping 300 by merging two logical address groups 302 into one group, by updating the lookup table 303. For example, logical address groups 1 and 2 may be merged into a new logical address group 302, and corresponding physical address groups may be merged into a new physical address group 304. In a further embodiment, a map component 150 may select a new mapping function 306 for a merged logical address group 306.

Various other or further ways to update a logical-to-physical mapping 300 will be clear in view of this disclosure. Additionally, although examples of updates to a logical-to-physical mapping 300 are described with reference to the depicted embodiment of a mapping 300, it will be recognized that a map component 150 may similarly update any other mapping 300, such as a table-based mapping 300 that uses a table 303 for individual addresses without additional mapping functions 306, a function-based mapping 300 that uses mathematical or logical operations on a logical address to determine a corresponding physical address without a group-level lookup table 303, a device-level mapping 300 that maps any valid logical address for a device to a physical address, a per-group mapping 300 that applies particularly to logical addresses of one logical address group 302, or the like.

In further embodiments, the map component 150 may move data based on an updated logical-to-physical mapping 300. As described above, changing a logical-to physical mapping 300 may remap a logical address from an old physical address to a new physical address. In a further embodiment, the map component 150 may move data from the old physical address to the new physical address, so that the data is still accessible using the same logical address. In various embodiments, moving data may include reading data from an old location and writing data to a new location, swapping data between locations, writing data to a temporary location or cache during a move operation, or the like. Various ways to move data based on a changed mapping 300 will be clear in view of this disclosure.

In certain embodiments, updating a logical-to physical mapping 300 and moving data based on the updated mapping 300 may provide wear leveling for a non-volatile memory element 123 or a non-volatile memory device 120. For example, in one embodiment, changing a mapping 300 may remap a logical address that is a frequent target for write operations to a new physical address, so that a single physical location is not over-worn by repeated writes to the same logical address.

However, moving data for logical addresses to new physical locations may itself cause wear on a non-volatile memory element 123 or a non-volatile memory device 120. For example, in one embodiment, if the map component 150 changes a mapping function 306 that associates 1024 individual logical addresses in a logical address group 302 with 1024 individual physical addresses in a physical address group 304, then moving the data based on the changed mapping function 306 may include moving up to 1024 data units (e.g., bytes, pages, or blocks, or the like, depending on the granularity of the addressing) from old locations to new locations. In certain embodiments, wear due to moving data based on a changed mapping function 306 may be reduced or limited by moving data in a series of small moves, such as swapping data between a pair of physical addresses. For example, in one embodiment, a logical-to-physical mapping 300 may include a mapping function 306 prior to an update, an updated mapping function 306, and metadata indicating which data has been moved based on the updated mapping function 306 (e.g., indicating which mapping function 306 applies to which addresses.) A map component 150 may swap data between a pair of physical addresses, or otherwise move data among a limited number of physical locations based on the new mapping function 306, and may update metadata indicating that the updated mapping function 306 applies to the corresponding logical addresses.

Additionally, in certain embodiments, a map component 150 may perform a wear-leveling process by updating the mapping 300 and moving data periodically, or at intervals. Moving data periodically, or at intervals, may limit the amount of additional wear caused by the wear-leveling process. In various embodiments, "periodically" updating the logical-to-physical mapping 300 may refer to updating the logical-to-physical from time to time, or at intervals, whether the intervals are regular or irregular. For example, in one embodiment, periodic updates to a logical-to-physical mapping 300 may take place at scheduled times. In another embodiment, periodic updates to a logical-to-physical mapping 300 may take place when triggered by a condition occurring. For example, in one embodiment, periodically updating the logical-to-physical mapping 300 may include updating the logical-to-physical mapping 300 based on a trigger such as updating after every 100 writes, updating after every 500 accesses (reads or writes), updating after an amount of time, or the like. A trigger for updating the logical-to-physical mapping 300 may be predetermined, randomly selected from a predetermined range, or the like. Various ways to update a logical-to-physical mapping 300 periodically, or to trigger a periodic update to a logical-to-physical mapping 300, will be clear in view of this disclosure.

In various embodiments, a map component 150 that performs a wear-leveling process for one or more non-volatile memory elements 123 by periodically updating a mapping 300 and moving data based on the updated mapping 300 may detect a wear-based attack for the one or more non-volatile memory elements 123, and may change the wear-leveling process in response to detecting the attack. Detecting an attack is described in further detail below with reference to the attack detection module 804 of FIG. 8.

Changing the wear-leveling process is described in further detail below with reference to the wear-level update module 806 of FIG. 8, and with reference to the sequences of logical-to-physical mappings, and wear-leveling parameters described below with reference to FIGS. 4-7.

FIG. 4 depicts sequences 410, 420, 430 of logical-to-physical mappings, 414, 424, 434, in various embodiments. In various embodiments, a map component 150 that performs a wear-leveling process by periodically updating a logical-to-physical mapping and moving data may update a logical-to-physical mapping following a sequence 410, 420, 430. The map component may update from one logical-to-physical mapping 414, 424, 434 in a sequence 410, 420, 430 to the next logical-to-physical mapping 414, 424, 434 in the sequence 410, 420, 430.

Figure 5:
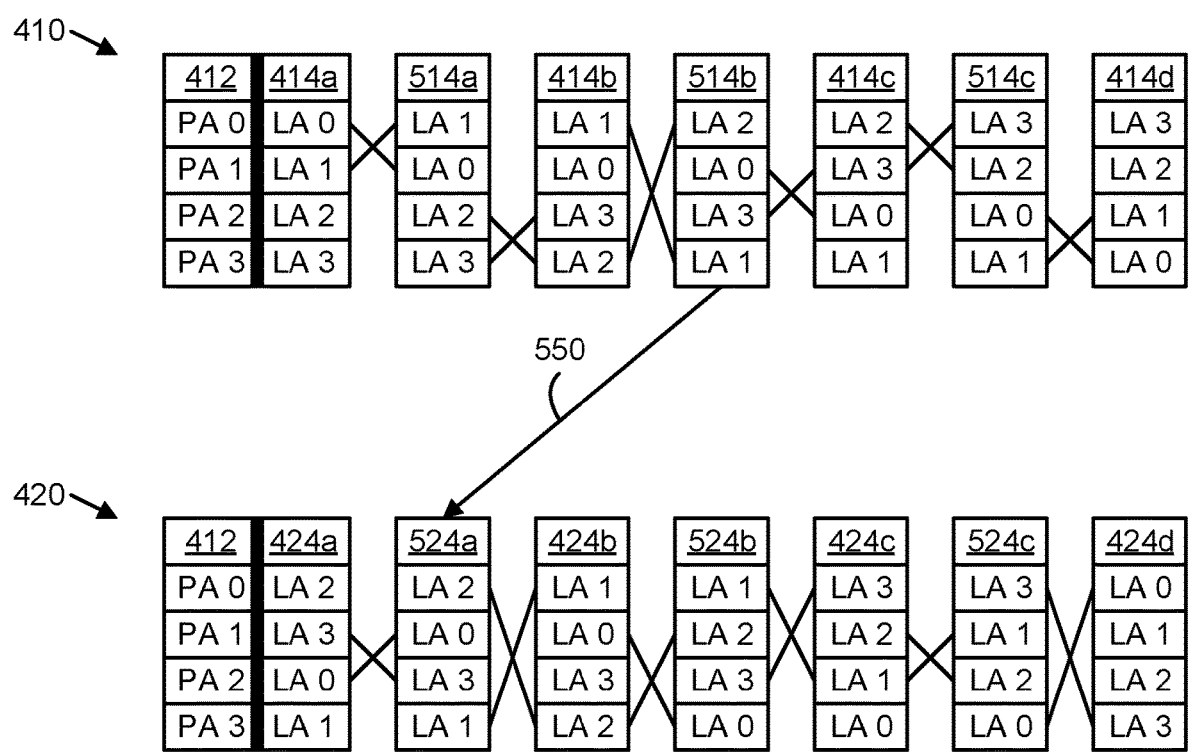
FIG. 5 is a schematic block diagram illustrating one embodiment of a change between sequences of logical-to-physical mappings.

In the depicted embodiments, a sequence 410, 420, 430 includes an ordered or enumerated set of logical-to-physical mappings 414, 424, 434, that map logical addresses (e.g., LA 0, LA 1, LA 2, LA 3) to physical addresses 412 (e.g., PA 0, PA 1, PA 2, PA 3). In FIGS. 4-6, rows correspond to physical addresses 412, which are shown to the left of the sequences 410, 420, 430. Logical-to-physical mappings 414, 424, 434 are depicted as columns, with logical addresses in the rows corresponding to physical addresses to which the logical addresses are mapped. For example, logical-to-physical mapping 414*b*, in sequence 410, is depicted as a column with logical address LA 1 in the top row, and logical addresses LA 0, LA 3, and LA 2 in subsequent rows, indicating that logical address LA 1 is mapped to physical address PA 0, logical address LA 0 is mapped to physical address PA 1, logical address LA 3 is mapped to physical address PA 2, and logical address LA 2 is mapped to physical address PA 3. For illustrative purposes, logical-to-physical mappings 414, 424, 434 are depicted as mapping four logical addresses to four physical addresses. However, in various embodiments, a sequence 410, 420, 430 may include mappings 414, 424, 434 for larger numbers of logical addresses. For example, a mapping 414, 424, 434 may be a mapping function 306 for a group 302 of logical addresses, a mapping 300 for multiple groups 302 of logical addresses (e.g., a device-level or die-level mapping), or the like, as described above with regard to FIG. 3. Various types of mappings 300 that may be implemented in sequences will be clear in view of this disclosure.

In the depicted embodiment, a sequence 410, 420, 430 includes a set of mappings in order from left to right, indicated by alphabetic suffixes to the reference numerals. The order of mappings is from left to right, so that the periodic mapping updates performed by the map component 150 update from one depicted mapping to the next depicted mapping to the right. For example, in the depicted embodiment, the sequence 410 includes four different logical-to-physical mappings 414*a*, 414*b*, 414*c*, 414*d*, and a map component 150 may periodically update the mapping, going from mapping 414*a* to mapping 414*b*, then from mapping 414*b* to mapping 414*c*, and so on.

The sequence 410, in the depicted embodiment, is a sequence 410 based on a bitwise XOR function. In the depicted embodiment, the first mapping 414*a* in the sequence 410 maps logical addresses to physical addresses 412 by XORing the logical address with the number 0 as a bitmask, thus mapping logical address LA 0 to physical address PA 0, mapping logical address LA 1 to physical address PA 1, mapping logical address LA 2 to physical address PA 2, and mapping logical address LA 3 to physical address PA 3. In the depicted embodiment, the bitmask is increased by 1 between mappings 414 in the sequence 410. Accordingly, the second mapping 414*b* in the sequence 410 maps logical addresses to physical addresses 412 by XORing the logical address with the number 1 as a bitmask, thus mapping logical address LA 0 to physical address PA 1, mapping logical address LA 1 to physical address PA 0, mapping logical address LA 2 to physical address PA 3, and mapping logical address LA 3 to physical address PA 2. Similarly, the third mapping 414*c* in the sequence 410 maps logical addresses to physical addresses 412 by XORing the logical address with the number 2 as a bitmask, and the fourth mapping 414*d* in the sequence 410 maps logical addresses to physical addresses 412 by XORing the logical address with the number 3 as a bitmask.

In another embodiment, a sequence of logical-to-physical mappings based on an XOR function may be created by using a sequence of bitmasks other than the "0, 1, 2, 3" sequence used in the depicted embodiment for sequence 410. For example, a sequence of logical-to-physical mappings may be based on a decreasing sequence of bitmasks, a sequence that alternates between high bitmasks and low bitmasks, or any other sequence of bitmasks. Additionally, although two-bit bitmasks between "0" and "3" are described for mapping four logical addresses to four physical addresses, bitmasks in another embodiment may be larger to map a larger group of logical addresses to a larger group of physical addresses. For example, a map component 150 may use a 10-bit bitmask to map a group of 1024 logical addresses to 1024 physical addresses, an 11-bit bitmask to map a group of 2048 logical addresses to 2048 physical addresses, or the like. Certain embodiments of ways to change a logical-to-physical mapping in a sequence based on bitmasks are described in U.S. patent application Ser. No. 15/949,976 entitled "MAPPING-BASED WEAR LEVELING FOR NON-VOLATILE MEMORY" and filed on Apr. 10, 2018 for Amir Hossein Gholamipour et al., which is incorporated herein by reference. Additionally, in various further embodiments, sequences of logical-to-physical mappings may be produced in various further ways, with or without basing mappings on an XOR function.

Sequence 420, in the depicted embodiment, is another sequence of logical-to-physical mappings 424*a-d*. In the depicted embodiment, the mappings 424 in sequence 420 are the same as the mappings 414 in sequence 410, but are in a different order. Although sequence 410 and sequence 420 include the same mappings 414, 424, another sequence may include one or more mappings that are not in the sequences 410, 420. For example, in the depicted embodiment, the mappings 434 in sequence 430 map four logical addresses and one temporarily unused "gap" to five physical addresses. In the first mapping 434*a* in sequence 430, logical addresses LA 0, LA 1, LA 2, and LA 3 are mapped to physical addresses PA 0, PA 1, PA 2, and PA 3, respectively, with the gap mapped to physical address PA 4. In subsequent mappings 434*a-e*, the "0, 1, 2, 3" order of logical addresses is maintained, but the gap is moved up. For example, in the next mapping 434*b* the gap is moved up to physical address PA 3, and logical addresses LA 0, LA 1, LA 2, and LA 3 are mapped to physical addresses PA 0, PA 1, PA 2, and PA 4, respectively. By mapping 434*e*, the gap has reached physical address PA 0; therefore the next mapping 434*f* does not move the gap up, but returns the gap to physical address PA 4, and re-orders the logical addresses. In another embodiments, a gap-based sequence of mappings may include a single gap, more than one gap, a different pattern for moving the gap(s), a different reordering of logical addresses upon repeating the pattern for moving the gap(s), or the like. Although three sequences 410, 420, 430, are depicted, other sequences of logical-to-physical mappings, and ways to generate sequences, will be clear in view of this disclosure. Additionally, although the sequences 410, 420, 430 are depicted as including four to eleven mappings, sequences in another embodiment may include a larger number of mappings, and/or may be cyclic sequences, restarting at the beginning after reaching the end.

In one embodiment, a map component 150 may perform wear-leveling by iterating through a single sequence of mappings, such as sequence 410. However, in certain embodiments, a map component 150 may be capable of implementing a plurality of sequences of mappings. For example, in one embodiment, two or more sequences, such as sequences 410 and 420 may be under consideration during the design of a device, and a map component 150 may be designed and built with hardware for implementing either sequence 410, 420, then configured to use one of the sequences (e.g., by setting or storing a parameter that selects one of the sequences). In certain embodiments, a map component 150 capable of using more than one sequence of logical-to-physical mappings for wear-leveling may change the wear-leveling process, in response to a wear-based attack, by changing the sequence of logical-to-physical mappings used when the logical-to-physical mapping is updated for wear-leveling.

In various embodiments, changing a sequence of logical-to-physical mappings, or otherwise changing a wear-leveling process, may avoid or counteract attacks that might otherwise cause excessive wear. For example, if a persistent attacker gathers enough information to analyze the wear-leveling behavior of a storage device, and infers that the map component 150 updates logical-to-physical mappings to the next mapping in sequence 410 after every 1000 write operations, the attacker could create excessive wear at physical address PA 0 by writing repeatedly to logical address LA 0 while mapping 414a was in use, then to logical address LA 1 while mapping 414b was in use, to logical address LA 2 while mapping 414c was in use and so on. However, a map component 150 that detects such an attack could mitigate or counteract the attack by switching to sequence 420. For example, instead of switching from mapping 414b to mapping 414c in sequence 410, the map component 150 may update the logical-to-physical mapping to mapping 424c in sequence 420. The attacker, expecting mapping 414c, would attempt to cause wear at physical address PA 0 by writing to logical address LA 2, but the new mapping 424c would map logical address LA 2 to physical address PA 1, thus diverting the wear caused by the attack to a new location.

FIGS. 5 and 6 further illustrate changes 550, 650 between sequences of logical-to-physical mappings. FIG. 5 depicts sequences 410 and 420, as described above with reference to FIG. 4, including mappings 414a-414d in sequence 410 and mappings 424a-424d in sequence 420. In certain embodiments, a map component 150 may implement a sequence of mappings for updating the logical-to-physical mapping by adding intermediate mappings 514, 524 to a sequence 410, 420.

In the depicted embodiment, changing to a new logical-to-physical mapping 414, 424 in a sequence 410, 420 (e.g., mapping 414a to mapping 414b, from mapping 424c to mapping 424d, or the like) remaps multiple logical addresses to new physical addresses. Although four logical addresses are depicted for illustrative purposes, updating a mapping function 306 for a logical address group 302, in certain embodiments, may remap the full set of logical addresses in the logical address group 302. For example, changing a bitmask used to map logical addresses to physical addresses using an XOR function may remap the full group of logical addresses to which the bitmask applies. In certain embodiments, remapping a group of logical addresses may involve moving data for the full set of logical addresses in the group, thus increasing wear on the device. Accordingly, in the depicted embodiment, the map component 150 includes intermediate mappings 514, 524 in the sequences 410, 420 of logical-to-physical mappings. In the depicted embodiment, the intermediate mappings 514, 524 are selected so that updating to the next mapping in a sequence 410, 420 (including the intermediate mappings 514, 524) involves remapping one pair of logical addresses.

Crossed lines in FIG. 5 indicate remapped pairs of logical addresses. For example, between mapping 414a and intermediate mapping 514a in sequence 410, logical address LA 0 is remapped from physical address PA 0 to physical address PA 1, and logical address LA 1 is remapped from physical address PA 1 to physical address PA 0. Along with swapping logical addresses LA 0 and LA 1 between physical addresses PA 0 and PA 1, the map component 150 may move data based on the updated mapping by swapping data between physical addresses PA 0 and PA 1. Thus, including the intermediate mapping 514a in the sequence 410 allows the map component 150 to move data for a pair of logical addresses when updating the mapping, rather than moving data for a full group of logical addresses. In various embodiments, a map component 150 may include more or fewer intermediate mappings 514, 524 in a sequence 410, 420 of mappings, based on the number of logical addresses to which the mappings apply, and the amount of data to be moved at once. For example, in a logical address group 302 that includes 1024 logical addresses, a sequence of mappings based on a bitmask (similar to sequence 410) may remap the full group of 1024 logical addresses in the group by changing the bitmask, and the map component 150 may include 511 intermediate mappings in the sequence between bitmask updates, so that each update to or from an intermediate mapping involves remapping and moving data for a pair of logical addresses. In another embodiment, for the same group of 1024 logical addresses, a map component may include fewer intermediate mappings in the sequence, so that that each update to or from an intermediate mapping involves remapping and moving data for two pairs of logical addresses, four pairs of logical addresses, or the like.

In various embodiments, a map component 150 may keep track of mappings in a sequence 410, 420 in various ways. For example, in one embodiment, a map component 150 may store a list of mappings in the sequence 410 including mappings 414 and intermediate mappings 514. In another embodiment, a map component 150 may store information about a current mapping and a rule or set of rules for generating the next mapping 414, the next intermediate mapping 514, or the like. In another embodiment, a map component 150 may track intermediate mappings 514 based on metadata indicating progress between non-intermediate mappings 414. For example, a map component 150 may store metadata indicating that a transition is in progress between mapping 414a and mapping 414b, and indicating which pairs of logical addresses have been swapped in that transition, how many pairs of logical addresses have been swapped in a predefined swap order, or the like. Various other or further ways of including intermediate mappings 514, 524 in a sequence 410, 420 of logical-to-physical mappings, and of keeping track of current and next mappings, or of progress between mappings, will be clear in view of this disclosure.

In certain embodiments, where the wear-leveling process includes updating logical-to-physical mappings according to a sequence, such as sequence 410 or sequence 420, changing a wear-leveling process in response to a wear-based attack may include changing a sequence of logical-to-physical mappings. In some embodiments, a map component 150 may change the sequence of logical-to-physical mappings by changing from a first sequence to a second sequence at a mapping common to the first sequence and the second sequence. In the depicted embodiment, a change 550 between sequences 410, 420 is at a mapping common to both sequences 410, 420.

The terms "first sequence" and "second sequence" as used herein, refer to a sequence of logical-to-physical mappings prior to a change, and subsequent to a change, respectively. For example, in the depicted embodiment, the change 550 is from sequence 410 to sequence 420, (as indicated by the direction of the arrow depicting the change 550) making sequence 410 the first sequence, and sequence 420 the second sequence. However, in another embodiment, a change 550 may be from sequence 420 to sequence 410, making sequence 420 the first sequence, and sequence 410 the second sequence. Similarly, in another embodiment, a map component 150 may be capable of switching between three or more sequences, and any two sequences in use prior to and after a change may be referred to as a first sequence and a second sequence, respectively, regardless of any other ordering of the sequences.

As described above, a sequence may be any ordered set of mappings, including intermediate mappings. In a further embodiment, a mapping common to the first sequence and the second sequence may refer to a mapping that is in the ordered set of mappings, including intermediate mappings, for the first sequence, and in the ordered set of mappings, including intermediate mappings, for the second sequence. In certain embodiments, changing from a first sequence to a second sequence at a mapping common to the first sequence and the second sequence may include changing sequences when the mapping currently in use (e.g., in the first sequence) is common to both mappings. Thus, in further embodiments, where the sequence change is at a mapping common to both sequences, a map component 150 may change sequences without changing the current mapping or moving data.

For example, in the depicted embodiment, a map component 150 that performs a wear-leveling process using sequence 410 as a sequence for updating logical-to-physical mappings may detect a wear-based attack when mapping 514*b* is the current logical-to-physical mapping. In the depicted embodiment, mapping 514*b*, an intermediate mapping in sequence 410, is identical to mapping 524*a*, an intermediate mapping in sequence 420. Thus, in the depicted embodiment, the mapping 514*b* is common to both sequences 410, 420, and the map component may implement a change 550 from the first sequence 410 to the second sequence 420 by updating metadata indicating that the second sequence 420 is in use, and indicating how far along the sequence 420 the current mapping or the next mapping is (e.g., indicating that the current mapping is mapping 524*a*, or that the next mapping is mapping 424*b*). In various embodiments, map components 150 may implement sequence changes at mappings common to both sequences, by updating metadata or parameters in various ways, without changing a mapping or moving data. For example, in various embodiments, a map component 150 may update one or more parameters that indicate which sequence 410, 420 is in use, update one or more parameters that indicate which mapping 514, 524 in the sequence 410, 420 is in use, which mapping 514, 524 to use next in the wear-leveling process, or the like.

In further embodiments, a map component 150 may permit access to data of the non-volatile memory elements while changing from a first sequence to a second sequence at a common mapping. In certain embodiments, where changing sequences at a mapping common to both sequences involves updating metadata without changing the current mapping or moving data, a map component 150 may permit reads and writes using the current mapping. By contrast, data requests received during a mapping change may be blocked or delayed until the change and the corresponding data move is completed. For example, if a mapping has been updated so that a logical address is remapped to a new physical address, but if data for the logical address has not yet been moved to the new physical address, then attempting to perform a read operation for the logical address may result in the wrong data being read. Accordingly, in certain embodiments, a map component 150 may block read and write requests when updating mappings and moving data for wear-leveling, but may permit read and write requests without blocking during a sequence change 550 that does not change the current mapping. In another embodiment, however, a map component 150 may read data into a cache or another temporary location when updating a mapping and moving data for wear/leveling, and/or for a sequence change that changes the current mapping, and may service read requests from the cache or temporary location during the mapping change, without blocking the read requests. Similarly, a map component may cache or temporarily store data of write requests during a mapping change without blocking the write requests, and may complete the write request using the cached data in response to the mapping change completing.

In certain embodiments, some mappings may not be common to both sequences. For example, in the depicted embodiment, the mapping 514*a*, in sequence 410, does not appear in sequence 420. Accordingly, if the map component 150 detects a wear-based attack when mapping 514*a* is in use, then in one embodiment, the map component 150 may continue the wear-leveling process using sequence 410, and wait until the mapping 414*b* is in use before changing to the second sequence 420 in response to the wear-based attack. Mapping 414*b* is common to both sequences 410, 420, being identical to mapping 424*b* in sequence 420, allowing the map component 150 to change sequences without moving data or blocking access. In another embodiment, however, the map component 150 may change from a first sequence to a second sequence at a mapping that is not common to both sequences. For example, if the map component 150 detects a wear-based attack when mapping 514*a* is in use, then in certain embodiments the map component may change the sequence of logical-to-physical mappings to sequence 420 by updating the current logical-to-physical mapping to any mapping in the sequence 420, and moving data based on the changed mapping. In certain embodiments, changing the sequence of logical-to-physical mappings by changing the current logical to physical mapping and moving data may cause more wear than changing the sequence of logical-to-physical mappings at a mapping common to both sequences, but may allow the map component 150 to change the wear-leveling process in response to a wear-based attack more quickly, without waiting for the unchanged wear-leveling process to update to a mapping common to both sequences.

FIG. 6 depicts another embodiment of a change 650 between sequences of logical-to-physical mappings. FIG. 6 depicts sequences 410 and 430, as described above with reference to FIG. 4, including mappings 414a-414d in sequence 410 and mappings 434a-434k in sequence 430. The intermediate mappings 514 of sequence 410, described above with reference to FIG. 5, are not depicted as part of sequence 410, but may be included in the sequence 410 by a map component 150, as described above.

In the depicted embodiment, the map component 150 implements a change 650 from a first sequence 410 of logical-to-physical mappings 414 to a second sequence 430 of logical-to-physical mappings 434 by changing the current logical-to-physical mapping and moving data. For example, in one embodiment the map component 150 may detect a wear-based attack while the current mapping is mapping 414b, in sequence 410. Mapping 414b is not a mapping in the sequence 430, but the map component 150 may change from sequence 410 to sequence 430 by updating the current mapping to any any mapping in the second sequence 430, and moving data accordingly. For example, in the depicted embodiment, the map component 150 implements a change 650 from a first sequence 410 to a second sequence 430, by updating the mapping from mapping 414b in the first sequence 410 to mapping 434e in the second sequence 430, and moving data for remapped logical addresses to new physical addresses.

In certain embodiments, a map component 150 changing from a bitmask-based sequence 410 to a gap-based sequence 430 may change group definitions for one or more physical address groups 304 so that the size of a physical address group is larger than the size of a logical address group 302, allowing gaps. Changing group definitions may involve further data moves, but may further counter a wear-based attack because the change to group definitions significantly modifies the wear-leveling process. In another embodiment, group definitions for a bitmask sequence map may already include more physical locations in a physical address group than logical addresses in a logical address group. The extra physical locations may not correspond to logical addresses, but may be kept as spares for replacing defective locations, used for storing further parity or error correction information, or the like.

In another embodiment, the map component 150 may change from a first sequence 410 to a gap-based sequence 430 at a mapping common to both sequences. For example, although sequence 410 is not depicted as mapping any logical addresses to physical address PA 4, the group of physical addresses that includes physical addresses PA 0 through PA 3 may also include physical address PA 4, as a physical address not used by the mappings 414 in the first sequence 410 (e.g., equivalent to a gap in the second sequence 430). Accordingly, in one embodiment, some mappings 414 in the first sequence 410, with the addition of an implied gap at physical address PA 4, may be equivalent to some of the mappings 434 in the second sequence. For example, in the depicted embodiment, mappings 414a and 414c in the first sequence 410 are common to both sequences 410, 430, being equivalent to mappings 434a and 434k, respectively, in the second sequence 430. Accordingly, in certain embodiments, a map component 150 that detects a wear-based attack may change the wear-leveling process by switching from sequence 410 to sequence 430 at mappings 414a and 414c, without moving data or blocking access. Various other or further ways for a map component 150 to change a sequence of logical-to-physical mappings for the wear-leveling process, or to change between sequences, with or without moving data, will be clear in view of this disclosure FIG. 7 is a table illustrating certain embodiments of wear-leveling parameters 700. In certain embodiments, a map component 150 may change a wear-leveling process in response to detecting a wear-based attack by changing one or more wear-leveling parameters 700.

In various embodiments a wear-leveling parameter 700 may refer to any value such as a number, a text-based value, or the like that defines, describes, or corresponds to a characteristic of a wear-leveling process. In further embodiments, certain parameters 700 may be updateable, to change characteristics of a wear-leveling process. For example, updatable parameters 700 may be stored in volatile memory, in non-volatile memory, in a register, or the like, and may be referred to by the map component 150 during the wear-leveling process, so that changing the stored value for a parameter 700 changes the wear-leveling process.

In the depicted embodiment, the wear-leveling parameters 700 include a trigger 702 for updating the logical-to-physical mapping, a quantity or size 704 of data to move, a number 706 of logical and physical address groups 302, 304, and a group size 708. Additionally, in the depicted embodiment, the parameters 700 include two alternative sets of parameters 720a, 720b. In certain embodiments, a map component 150 may change a wear-leveling process in response to detecting a wear-based attack by changing a wear-leveling parameter 700, updating a stored parameter value, changing between different sets 720 of wear-leveling parameters, or the like. For example, in one embodiment, a map component 150 may modify one or more parameters 700 in a set 720. In another embodiment, a map component 150 may switch from using one set of parameters (e.g., set 720a) to another set of parameters (e.g., set 720b).

A trigger 702 for updating the logical-to-physical mapping may be any parameter relating to when or how often a logical-to-physical mapping is updated in the wear-leveling process. In certain embodiments, a trigger 702 may include a threshold value compared to a counter, for triggering updates to the logical-to-physical mapping. For example, a counter may count write requests, accesses including reads and writes, a number of seconds since a previous update, a number of program/erase cycles, or the like. In another embodiment, a counter may count down, and may count write requests remaining until the next update, accesses remaining until the next update, seconds remaining until the next update, or the like. In another embodiment, a threshold value for a trigger 702 may be compared to some measurement or factor that changes along with wear, whether the measurement or factor is incremented or decremented as a counter or not. For example, a trigger 702 for updating a logical-to-physical mapping may include a threshold value compared to a quantity such as leakage current, corresponding to actual wear.

In further embodiments, map component 150 may update the logical-to-physical mapping, as part of the wear-leveling process, when a trigger 702 is satisfied, such as when a condition is satisfied, or when a counter or other measurement equals or exceeds a threshold value (or falls below a threshold value, for a decrementing counter). For example, when the set 720a of parameters is in use, the map component 150 may update logical-to-physical addresses and move data after every 100 writes. In certain embodiments, one or more triggers 702 may be associated with one or more priority levels for updating mappings and moving data. For example, the map component 150 may be configured to wait for an idle period to update mappings and move data if a low-priority trigger 702 is satisfied, but to block further access in order to update mappings and move data immediately if a high-priority trigger 702 is satisfied.

A quantity or size 704 of data to move, in various embodiments, may be a parameter 700 specifying how many logical addresses are remapped when the map component 150 updates a logical-to-physical mapping as part of the wear-leveling process, or, equivalently, how much data is moved based on the updated remapping. In one embodiment, a map component 150 may configure (or omit) intermediate mappings 524, as described above with respect to FIG. 5, in a sequence of logical-to-physical mappings, based on the quantity of data to move at each update. For example, in the depicted embodiment, when the set 720*a* of parameters is in use, the map component 150 may include intermediate mappings 524 in a sequence of logical-to-physical mappings in such a way that two data locations are moved per mapping update. In a further embodiment, such as when the set 720*b* of parameters is in use, the map component 150 may include fewer intermediate mappings 524 in a sequence of logical-to-physical mappings, or may omit intermediate mappings 524 from a sequence of logical-to-physical mappings, in such a way that four data locations are moved per mapping update. Various ways to configure a sequence of mappings for wear-leveling based on an amount of data to move per mapping update will be clear in view of this disclosure.

In certain embodiments, parameters 700 may pertain to a group-based logical-to-physical mapping. A group-based logical-to-physical mapping may refer to any mapping based on groups of logical or physical addresses, such as a mapping that maps groups of logical addresses to groups of physical addresses at a top level, then maps individual logical addresses within a logical address group 302 to individual physical addresses within the corresponding physical address group 304. For example, the mapping 300 described above with regard to FIG. 3 is one embodiment of a group-based mapping. In some embodiments, one or more parameters 700 for a group-based mapping may relate to how groups are defined or described. For example, in one embodiment, parameters 700 may include a number 706 of logical and physical address groups 302, 304. Addressable storage locations may be divided into two groups, three groups, four groups, twenty groups, one hundred groups, or any other number of groups. Mappings with larger numbers of groups may use more memory or storage for mapping logical address groups 302 to physical address groups 304, but may provide more flexible wear-leveling. Conversely, mappings with smaller numbers of groups may use less memory or storage for group-level mapping, and/or may provide faster mapping performance, at the expense of some flexibility. In a certain embodiment, parameters 700 for a group-based mapping may include a group size 708. A group size 708 may specify a number of addresses or locations per group, a storage capacity for a group, or the like. Various other or further parameters 700 for a wear-leveling process will be clear in view of this disclosure In certain embodiments, parameters 700 may be coprime to the number ten. A number that is coprime to the number ten has no factors (other than the number one) in common with the number ten, and is thus not divisible by two or five. In certain embodiments, wear-based attacks may include accidental or intentional alignment between a pattern of accesses (e.g., reads or writes) for a client 116, and the wear-leveling process. For example, if a client 116 frequently writes to the same logical address, but attempts to avoid overwear by periodically switching to a new logical address, then a client 116 that switches addresses every 100 writes may accidentally align with a wear-leveling process that updates mappings every 100 writes, so that the client writing to a new logical address is actually writing to the same physical address.

In some embodiments, client access patterns may be based on powers of two, or powers often. Thus, in certain embodiments, using one or more wear-leveling parameters 700 that are coprime to the number ten may avoid or counter accidental alignment between wear-leveling and client access patterns. For example, if the number of writes between mapping updates (or another trigger 702) is not divisible by two or five, then it may be less likely that a client will switch to writing data to a new logical address at the same time as a logical-to-physical mapping update. In one embodiment, a map component 150 may change one or more wear-leveling parameters 700 that are divisible by two or five to new values that are coprime to the number ten, in response to detecting a wear-based attack. In another embodiment, a map component 150 may use one or more wear-leveling parameters 700 that are coprime to the number ten, regardless of whether it has detected a wear-based attack or not.

In the depicted embodiment, the parameters 700 include one set 720*a* of parameters that are divisible by two or five, and another set 720*b* of parameters that are coprime to the number ten. For example, in set 720*a*, the trigger 702 for moving data and updating the logical-to-physical mapping is every 100 writes, which is divisible by both 2 and 5. Conversely, in set 720*b*, the trigger 702 for moving data and updating the logical-to-physical mapping is every 501 accesses (e.g., reads or writes), which is coprime to the number 10.

In the depicted embodiment, the quantity or size 704 of data to move per mapping update is a number of locations that is divisible by two in both sets 720 of parameters. Moving data for an even number of locations may facilitate swapping data between pairs of locations. However, in another embodiment, a size 704 of data to move per mapping update may be a number of locations that is coprime to the number ten. For example, data may be moved cyclically among three locations. In a certain embodiment, a size 704 of data to move per mapping update may be a number of pairs to swap that is coprime to the number ten, or the like.

In certain embodiments, a number of addresses per nonvolatile memory element 123 or device 120 may be set by a manufacturer or by industry standard, and may be a power of two or a power of ten. Dividing a total number of locations into groups for a group-based mapping may result in a group size 708 or a number 706 of groups that is divisible by two or five. For example, in the depicted embodiment, one hundred locations or addresses are divided into four groups of twenty-five in set 720*a* of parameters 700. (Small numbers are depicted for illustrative purposes, but a larger number of locations may be provided in another embodiment.) In certain embodiments, however, one or more addresses or locations may be left outside of the groups (e.g., reserved for remapping of bad locations, used for parity or error correcting data, or the like), to provide a total number of in-use locations with factors other than two or five, thus facilitating division of the locations into groups where the group size 708 and/or the number 706 of groups are coprime to the number 10. For example, in the depicted embodiment, in set 720*b* of parameters 700, one of the one hundred locations is omitted from the groups, and the remaining locations are divided into three groups of thirtythree locations, so that the number 706 of groups and the group size 708 are both coprime to the number ten.

In certain embodiments, a map component 150 may vary at least one wear-leveling parameter 700 over time. For example, in some embodiments, a map component 150 may change a wear-leveling parameter 700, switch to a new set 720 of wear-leveling parameters 700, or the like, at predetermined times or intervals, at random times or intervals, at pseudo-random times or intervals, or the like. In various embodiments, a map component 150 may vary, change, or select a new wear-leveling parameter according to a random sequence, a pseudo-random sequence, or a predetermined sequence. For example, in a predetermined sequence, a map component 150 may vary a trigger 702 by updating mappings after 100 writes, then after the next 101 writes, then after the next 102 writes and so on. In a random or pseudo-random sequence, a map component 150 may vary a parameter 700 by using a random or pseudo-random number generator or selector to select a number of writes until the next mapping from a range or set of possible values for the parameter. For example, in one embodiment, a map component 150 may randomly or pseudo-randomly select a number of writes until the next mapping, as a trigger 702, from a range of 50-150 writes.

In further embodiments, a map component 150 may change a wear-leveling parameter to a value randomly or pseudo-randomly generated according to a probability distribution, such as a uniform probability distribution, a normal distribution, a Bernoulli distribution, a binomial distribution, or the like, where the probability distribution may be constrained to values suitable for the parameter. In another embodiment, a map component 150 may use a randomly or pseudo-randomly generated number to select a parameter value from an ordered list or set of possible values, from a range of possible values, or the like. Random or pseudo-random numbers used by the map component 150 may generated by a hash, scrambler, or encryption engine, seeded from an internal property of the non-volatile memory device, or from a property available to the device manufacturer, or the like, or may be pre-generated and stored as a list. Various other or further ways to generate random or pseudo-random numbers, and to use them to vary wear-leveling parameters over time, will be clear in view of this disclosure.

In some embodiments, a map component 150 may vary at least one wear-leveling parameter 700 across elements of the one or more non-volatile memory elements 123, or across groups of physical storage locations. For example, in one embodiment, a map component 150 for the device controller 126 may use one set 720 of parameters 700 for a one non-volatile memory element 123, and a different set 720 of parameters 700 for another non-volatile memory element 123. In another embodiment, a map component 150 may use different parameters 700 or sets 720 of parameters 700 for different storage regions, such as for different logical or physical address groups 302, 304. In various embodiments, varying parameters 700 over time or across regions or storage elements may make it more difficult for a persistent attacker to infer characteristics of the wear-leveling process, or to create an access pattern that targets the wear-leveling process.

Figure 8:
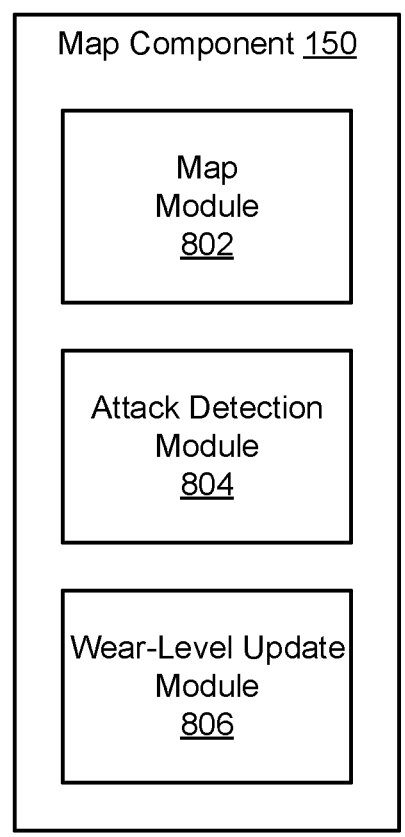
FIG. 8 is a schematic block diagram illustrating one embodiment of a map component.

FIG. 8 is a schematic block diagram depicting one embodiment of a map component 150. In the described embodiment, the map component 150 may be substantially similar to the map component 150 described above with regard to FIGS. 1-7. In the depicted embodiment, the map component 150 includes a map module 802, an attack detection module 804, and a wear-level update module 806.

The map module 802, in one embodiment, may perform a wear-leveling process for one or more non-volatile memory elements 123 by periodically changing or updating a logical-to-physical mapping and moving data based on the changed or updated mapping. As described above, a logical-to-physical mapping may be any function, operation, data structure, or the like that associates logical addresses with physical addresses. For example, a logical-to physical mapping may include a mapping table, a mathematical mapping function, a combination such as an any-to-any mapping between groups of addresses with mathematical mapping functions for addresses within groups (e.g., the mapping 300 of FIG. 3), or the like.

In further embodiments, changing or updating a mapping may include remapping at least one logical address to a new physical address. For example, a map module 802 may change a mapping by remapping a pair, group, or other set of logical addresses, or the like, to different physical addresses. In certain embodiments, a map module 802 may change or update a mapping according to a sequence of logical-to-physical mappings (e.g., including or omitting intermediate mappings as described above with regard to FIG. 5), by updating from one mapping in the sequence to the next mapping in the sequence.

In certain embodiments, a map module 802 may change or update a mapping according to a set of one or more wear-leveling parameters. For example, a map module 802 may update a mapping by referring to stored parameters to determine when to update the mapping, how many locations to remap (or how much data to move) when updating the mapping, or the like. Wear-leveling parameters are described above with reference to FIG. 7.

In various embodiments, the map module 802 may move data based on a changed or updated mapping. In certain embodiments, where changing a mapping remaps a logical address to a new physical address, the map module 802 may move data associated with the logical address to the new physical address. In one embodiment a map module 802 may move data after waiting for data access operations (e.g., read or write operations) to complete. In another embodiment, a map module 802 may move data by blocking data access operations to move the data. In certain embodiments, parameters 700 for a wear-leveling process may include one or more thresholds or triggers for updating mappings and moving data. For example, a trigger may be based on an access statistic that describes storage operations for a device, element, address, location, or the like.

In one embodiment, a first threshold for moving data may be a low-priority threshold, and the map module 802 may move data after waiting for data access operations to complete, in response to an access statistic satisfying the first threshold. In a further embodiment, a second threshold for moving data may be a high-priority threshold, and the map module 802 may move data after waiting for data access operations to complete, in response to the access statistic satisfying the second threshold. For example, in one embodiment, a map module 802 may be configured to wait and perform a non-blocking data move (e.g., a move that does not interfere with data access) if a group of logical addresses has been written to at least 100 times, but may be configured to block access operations to move the data if the group has been written to 150 times or more. In certain embodiments, providing a low-priority threshold for non-blocking data moves may avoid or reduce conflicts between the wear-leveling process and normal read or write operations, while providing a high-priority threshold for data moves that block other access may avoid or counter a persistent attack where repeated storage requests could otherwise take priority over wear-leveling. Additionally, a map module 802 that implements non-blocking and blocking data moves based on multiple thresholds may cause data moves to occur at varying intervals, thus reducing the likelihood of inadvertent alignment between an access pattern from a client and the wear-leveling process.

In certain embodiments, a map module 802 may use a logical-to-physical mapping to convert logical addresses associated with storage requests to physical addresses. For example, in one embodiment, a map module 802 may communicate with an external command/address bus for a non-volatile memory element 123 or device 120, and may receive a logical address in association with a read request, a write request, or the like. In a further embodiment, the map module 802 may convert the logical address to a physical address for use on an internal address bus, an internal command/address queue, or the like, and the physical address may be used for performing the requested read or write operation.

A map module 802, in certain embodiments, may include registers, latches, memory, storage, or the like for storing mappings, mapping sequences, mapping parameters, or the like. In further embodiment, a map module 802 may include logic hardware for applying the mapping to translate logical addresses to physical locations, for determining the next mapping in a sequence, for determining intermediate mappings in the sequence, or an order for moving data, or the like. Various other or further hardware of a map module 802, in various embodiments, will be clear in view of this disclosure.

The attack detection module 804, in one embodiment, is configured to detect a wear-based attack for one or more non-volatile memory elements 123 or storage locations. A wear-based attack, in various embodiments, may be a pattern or sequence of accesses (e.g., reads or writes) that is damaging to a non-volatile memory medium, or that is consistent with an attempt to damage or otherwise exploit a non-volatile memory medium by repeated accesses. In certain embodiments, a wear-based attack may be a deliberate attempt to damage or exploit a non-volatile memory element or device. In some embodiments, a wear-based attack may be an inadvertent or non-intentional access pattern that is consistent with or similar to a deliberate attempt to damage or exploit a non-volatile memory element or device.

In one embodiment, a wear-based attack may include repeated writes to a small subset of addresses or locations, or to a single address or location. Repeated writes to a single logical address or a small subset of logical addresses may indicate a deliberate attempt to degrade the performance or remaining lifetime of a non-volatile memory element or device, or may indicate inadvertent wear by client software that either does not spread wear among a larger set of addresses, or that relies on wear-leveling by the device 120 to distribute wear among multiple locations. Repeated writes to a single physical address or to a small subset of physical addresses, particularly across updates to the logical-to-physical mapping performed in the wear-leveling process, may indicate that an attacker has detected, inferred, or correctly guessed how to cause excessive wear despite the remapping of addresses, or may indicate inadvertent wear by client software that writes data to new addresses in a way that aligns with or negates the effects of the wear-leveling process.

Additionally, in certain embodiments, a wear-based attack may include repeated accesses, including reads and/or writes, to a small subset of addresses or locations, or to a single address or locations. In certain embodiments, reading from or writing to a region of a non-volatile memory array 200 (e.g., a region such as a word line or row of cells) may affect a neighboring region (e.g., an adjacent world line or row of cells). For example, voltages used in one region during read or write operations may affect the state of cells in a neighboring region due to parasitic capacitive coupling. Various other phenomena may cause operations in one region to disturb data in a nearby region. Conversely, in some embodiments, read or write operations for one region may be affected by the state of cells in an adjacent region. Accordingly, repeated reads and/or writes for certain regions may indicate an attempt to detect or modify data in neighboring regions. For example, repeated accesses to two rows of an array on either side of an unaccessed row may be part of an attempt to read or change data from the row in the middle, particularly if the middle row is not accessible by the client accessing the other rows. Such an attack may be an attempt at privilege escalation, an attempt to access secure data not belonging to the attacker, or the like.

In various embodiments, an attack detection module 804 may detect a wear-based attack in various ways, such as by monitoring access patterns, comparing access counts to thresholds, comparing access counts to expected or average access counts, comparing access frequencies to a threshold, comparing access frequencies to average frequencies, or the like. In one embodiment, an attack detection module 804 may detect a wear-based attack by determining whether an access count for one or more non-volatile memory elements violates a threshold.

An access count, in various embodiments, may be any count or measurement of accesses, such as a count of reads, a count of writes, a count of erase operations, a count of trim operations, a count of both reads and writes, a count of requested reads and/or writes, a count of externally-requested operations plus internal reads and/or writes performed during wear-leveling or garbage collection, or the like. For a non-volatile memory element 123, an access count may be a count for the element itself, a count for an individual logical or physical address, or a count for a set or group of one or more logical or physical addresses, such as a logical address group 302, a physical address group 304, or the like. In various embodiments, an access count may measure or count accesses over various time periods. For example, a count may measure an absolute count of accesses, a count of accesses since a cutoff time (e.g., accesses within the past hour, day, week, or month, accesses since the last update to the logical-to-physical mappings, accesses since the last reboot, or the like), a count of how many of the last N accesses are reads, a count of how many of the last N accesses are writes, a filtering of the prior counts over time, or the like.

A threshold may be a value that the attack detection module 804 compares to an access count to detect a wear-based attack. A threshold may be violated if an access count is above a threshold, at or above a threshold, or the like. Thresholds may be fixed, or may vary over time based on factors such as remaining device lifespan, evenness of existing wear to the device, or the like, and may be selected by a manufacturer, configured by a system administrator via an interface, or the like.

In one embodiment, the attack detection module 804 may detect a wear-based attack by determining that an access count violates a threshold, where the access count is a read count and/or a write count for a set of one or more logical addresses. Repeated attempts to access a logical address or a group of logical addresses may be frustrated by the wear-leveling process performed by the map module 802, but may cause more wear than the wear-leveling parameters 700 are configured to correct, or may be initial stages of a process that writes data to new addresses in a way that aligns with or negates the effects of the wear-leveling. Accordingly, in one embodiment, a map component 150 may perform wear-leveling normally if an access count for a set of logical addresses is below a threshold, but may detect a wear-based attack and change the wear-leveling process in response to an access count for a set of logical addresses violating a threshold.

In a certain embodiment, the attack detection module 804 may detect a wear-based attack by determining that an access count for a set of one or more physical addresses or locations violates a threshold, where the access count is a read count, a write count, an erase count, a trim count, a neighbor read count, a neighbor write count, and/or the like. A "neighbor" access count for an address or location, in various embodiments, may be a read count, write count, or other access count for a neighboring or adjacent address or location, a sum of read, write, or other access counts for multiple neighboring or adjacent addresses or locations, or the like. For example, a neighbor read count for a physical address may count read operations for the physical addresses immediately preceding and following the physical address. A neighbor access count for an address may reflect counts for addresses that are immediately adjacent to the address, or may also reflect counts for locations that are more distant, but that are still close enough to disturb data at the address. Additionally, physically neighboring addresses may or may not be consecutive. For example, in a three-dimensional array 200, one address may have neighboring addresses to any side, or above or below it, and some of the neighboring addresses may not be numerically adjacent. In a further embodiment, an address may be physically non-adjacent or distant from a "neighboring" address, but the addresses may be neighboring due to sharing controlling circuitry for sensing, programming, erasing, biasing, or other non-volatile media manipulation, such that accesses at one address affect the other address. Thus, in a further embodiment, a neighbor access count for an address may be a read count, write count, or other access count for one or more addresses that share controlling circuitry with the address.

In certain embodiments, an attack detection module 804 may monitor neighbor read counts and/or neighbor write counts for physical addresses and not for logical addresses, as the logical-to-physical mapping updates of the wear-leveling process may change which logical addresses correspond to neighboring regions. In another embodiment, however, an attack detection module 804 may monitor neighbor read counts and/or neighbor write counts for logical addresses, as an uninformed attacker may target neighboring logical addresses without realizing that the neighboring logical addresses may not correspond to neighboring physical addresses.

Repeated attempts to access a physical address or a group of physical addresses may indicate that a persistent attacker has found a way to circumvent the wear-leveling process, or that an access pattern for a client process is inadvertently aligned with the wear-leveling process. Repeated attempts to access neighboring physical addresses may indicate an attempt to read or change protected data. Accordingly, in one embodiment, a map component 150 may detect a wear-based attack and change the wear-leveling process in response to an access count for a set of physical addresses violating a threshold.

The attack detection module 804, in various embodiments, may monitor or be in communication with a command/address bus and/or a data bus to maintain access counts, and may include hardware for counting accesses, hardware for recording access counts (e.g., in a dedicated storage region, in a spare area for a physical address, or the like), logic hardware for comparing access counts to thresholds, registers, memory, or storage for storing current thresholds, or the like. Various other or further hardware for an attack detection module 804 will be clear in view of this disclosure.

The wear-level update module 806, in one embodiment, is configured to change or update the wear-leveling process performed by the map module 802, in response to a wear-based attack detected by the attack detection module 804. For example, the wear-level update module 806 may modify a wear-leveling parameter 700 and/or change a sequence 410, 420, 420 of logical-to-physical addresses in response to the attack detection module 804 determining that an access count violates a threshold.

In various embodiments, the wear-level update module 806 may change the wear-leveling process by updating or modifying any aspect of how or when the wear-leveling process is performed. In one embodiment, the wear-level update module 806 may change the wear-leveling process by modifying a wear-leveling parameter (e.g., by updating a stored parameter value), as described above with reference to FIG. 7. In a certain embodiment, the wear-level update module 806 may change the wear-leveling process by changing a sequence of logical-to-physical mappings, as described above with reference to FIGS. 4-6. For example, the wear-level update module 806 may change the order of mappings in a sequence, change the intermediate mappings in a sequence, switch from a first sequence of mappings to a second sequence of mappings, or the like. The map module 802 may continue performing the wear-leveling process as changed by the wear-level update module 806 (e.g., using a changed set of parameters 700, using a changed sequence of mappings, or the like).

In certain embodiments, in addition to changing the wear-leveling process in response to a wear-based attack, the wear-level update module 806 may make a further change to the wear-leveling process in response to a trigger. A trigger may be an event such as a scheduled time for a further change, an age of the device reaching a threshold, a read count reaching a threshold, a write count reaching a threshold, or the like. The further change to the wear-leveling process may be a change to a wear-leveling parameter, a change to the sequence of logical-to-physical mappings, or the like. In certain embodiments, changing the wear-leveling process in response to a trigger other than a wear-based attack may prevent (or increase the difficulty of) an attacker inferring a pattern for the wear-leveling process and crafting an attack based on the pattern, because an existing pattern may be changed at a time the attacker did not predict or detect.

Figure 9:
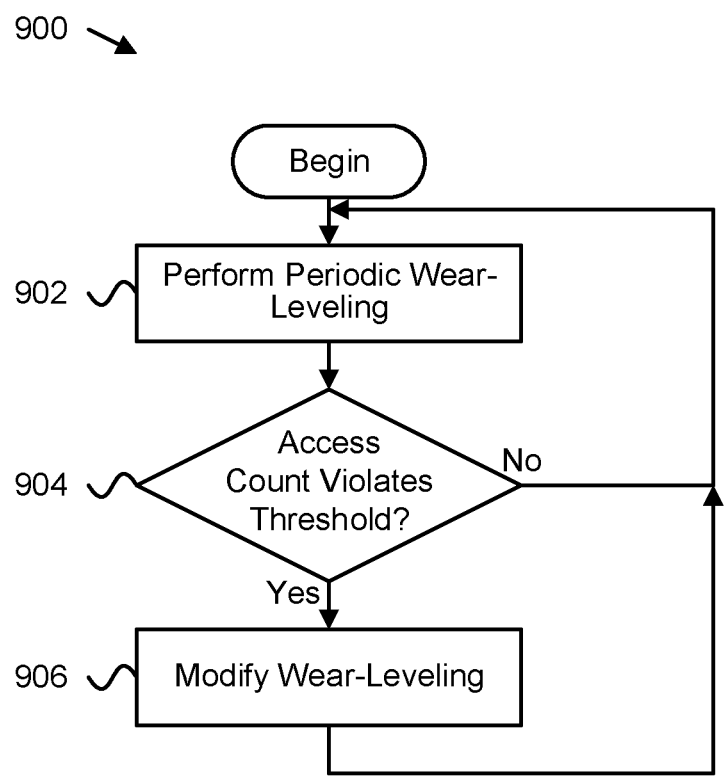
FIG. 9 is a schematic flow chart diagram illustrating one embodiment of a method of wear leveling with wear-based attack detection for non-volatile memory.

FIG. 9 is a schematic flow chart diagram illustrating one embodiment of a method 900 of wear leveling with wear-based attack detection for non-volatile memory. The method 900 begins, and a map module 802 performs 902 a wear-leveling process for one or more non-volatile memory elements 123, by periodically changing a logical-to-physical mapping and moving data based on the changed mapping. An attack detection module 804 determines 904 whether an access count for the one or more non-volatile memory elements violates a threshold. If the access count does not violate the threshold, the map module 802 continues to perform 902 the periodic wear-leveling process, and the method 900 continues. If the access count violates the threshold, the wear-level update module 806 modifies 906 the wear-leveling by updating a stored value for a wear-leveling parameter. The map module 802 continues to perform 902 the periodic wear-leveling process with the changed parameter, and the method 900 continues.

A means for wear-leveling one or more non-volatile memory elements, in one embodiment, may include one or more logical-to physical mappings or sequences of mappings, storage or memory media for storing mappings or mapping sequences, a map module 802, a map component 150, a die controller 206, a device controller 126, a device driver, other logic hardware, and/or other executable code stored on a computer readable storage medium. Other embodiments may include similar or equivalent means for wear-leveling.

A means for detecting a wear-based attack, in one embodiment, may include an attack detection module 804, a map component 150, a die controller 206, a device controller 126, a device driver, other logic hardware, and/or other executable code stored on a computer readable storage medium. Other embodiments may include similar or equivalent means for detecting a wear-based attack.

A means for changing a sequence of logical-to-physical mappings, in one embodiment, may include a wear-level update module 806, a map component 150, a die controller 206, a device controller 126, a device driver, other logic hardware, and/or other executable code stored on a computer readable storage medium. Other embodiments may include similar or equivalent means for changing a sequence of logical-to-physical mappings.

A means for changing a set of one or more wear-leveling parameters, in one embodiment, may include a wear-level update module 806, a map component 150, a die controller 206, a device controller 126, a device driver, other logic hardware, and/or other executable code stored on a computer readable storage medium. Other embodiments may include similar or equivalent means for changing wear-leveling parameters.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising
one or more non-volatile memory elements; and
a controller configured to:
  perform a wear-leveling process for the one or more non-volatile memory elements by:
    periodically updating a logical-to-physical mapping such that a number of writes between mapping updates is not divisible by the number two and the number of writes between mapping updates is not divisible by the number five, and
    moving data based on the updated mapping, wherein moving the data comprises selecting, based on a data access statistic, between performing a blocking data move and performing a non-blocking data move;
  detect a wear-based attack for the one or more non-volatile memory elements; and
  change the wear-leveling process in response to detecting the wear-based attack.

2. The apparatus of claim 1, wherein detecting the wear-based attack comprises determining that an access count violates a threshold, the access count comprising one or more of a read count and a write count, for a set of one or more logical addresses.

3. The apparatus of claim 1, wherein detecting the wear-based attack comprises determining that an access count violates a threshold, the access count comprising one or more of a read count, a write count, a neighbor read count, and a neighbor write count, for a set of one or more physical addresses.

4. The apparatus of claim 1, wherein changing the wear-leveling process comprises changing a wear-leveling parameter.

5. The apparatus of claim 1, wherein the wear-leveling parameter comprises one or more of a trigger for updating the logical-to-physical mapping and a quantity of data to move.

6. The apparatus of claim 1, wherein changing the wear-leveling process comprises changing a sequence of logical-to-physical mappings for updating the logical-to-physical mapping.

7. The apparatus of claim 6, wherein changing the sequence of logical-to-physical mappings includes changing the logical to physical mapping and moving data.

8. The apparatus of claim 6 wherein changing the sequence of logical-to-physical mappings comprises changing from a first sequence to a second sequence at a mapping common to the first sequence and the second sequence.

9. The apparatus of claim 8, wherein the controller is configured to permit access to the one or more non-volatile memory elements while changing from the first sequence to the second sequence.

10. The apparatus of claim 1, further comprising making a further change to the wear-leveling process in response to a trigger based on one or more of a scheduled time, an age, a read count, and a write count.

11. The apparatus of claim 1, wherein the controller is further configured to vary at least one wear-leveling parameter over time, according to one or more of a random sequence, a pseudo-random sequence, and a predetermined sequence.

12. The apparatus of claim 1, wherein the controller is further configured to vary at least one wear-leveling parameter across elements of the one or more non-volatile memory elements.

13. The apparatus of claim 1, wherein:
the non-blocking data move comprises waiting for data access operations to complete; and
the blocking data move comprises blocking data access operations to move the data.

14. A method comprising:
performing a wear-leveling process for one or more non-volatile memory elements by:
  periodically changing a logical-to-physical mapping such that a number of writes between mapping changes is not divisible by the number two and the number of writes between mapping changes is not divisible by the number five, and
  moving data based on the changed mapping, wherein moving the data comprises selecting, based on a data access statistic, between performing a blocking data move and performing a non-blocking data move;
determining whether an access count for the one or more non-volatile memory elements violates a threshold; and modifying a wear-leveling parameter by updating a stored parameter value, in response to determining that the access count violates the threshold.

15. The method of claim 14, further comprising varying the modified wear-leveling parameter over time, according to one or more of a random sequence, a pseudo-random sequence, and a predetermined sequence.

16. The method of claim 14, wherein the wear-leveling parameter is modified to be coprime to the number ten.

17. The method of claim 14, wherein updating the stored parameter value switches between sequences of logical-to-physical mappings for changing the logical-to-physical mapping.

18. An apparatus comprising:
    means for wear-leveling one or more non-volatile memory elements by:
        periodically updating a logical-to-physical mapping according to a set of one or more wear-leveling parameters and a sequence of logical-to-physical mappings, such that a number of writes between mapping updates is not divisible by the number two and the number of writes between mapping updates is not divisible by the number five, and
        moving data based on the updated mapping, wherein moving the data comprises selecting, based on a data access statistic, between performing a blocking data move and performing a non-blocking data move;
    means for detecting a wear-based attack for the one or more non-volatile memory elements; and
    means for changing the sequence of logical-to-physical mappings in response to detecting the wear-based attack.

19. The apparatus of claim 18, further comprising means for changing the set of one or more wear-leveling parameters in response to detecting the wear-based attack.

20. A system comprising:
    a plurality of physical storage locations for a storage device; and
    a device controller configured to:
        detect a wear-based attack for the plurality of physical storage locations;
        change a set of one or more wear-leveling parameters in response to detecting the wear-based attack; and
        perform a wear-leveling process using the changed set of one or more wear-leveling parameters, wherein performing the wear-leveling process comprises:
            periodically updating a logical-to-physical mapping such that a number of writes between mapping updates is not divisible by the number two and the number of writes between mapping updates is not divisible by the number five, and
            moving data based on the updated mapping, wherein moving the data comprises selecting, based on a data access statistic, between performing a blocking data move and performing a non-blocking data move.

21. The system of claim 20, wherein the wear-leveling process updates logical-to-physical mappings for data according to a sequence of logical-to-physical mappings, and the device controller is further configured to change the sequence in response to detecting the wear-based attack.

22. The system of claim 20, wherein the device controller is further configured to vary at least one wear-leveling parameter across groups of physical storage locations.

23. The system of claim 20, wherein the changed set of one or more wear-leveling parameters comprises a parameter coprime to the number ten.

24. The system of claim 20, wherein detecting the wear-based attack comprises determining that an access count violates a threshold, the access count comprising one or more of a read count, a write count, a neighbor read count, and a neighbor write count, for one or more of a logical address, a set of logical addresses, a physical storage location, and a set of physical storage locations.

* * * * *